(12) United States Patent
Rho et al.

(10) Patent No.: US 9,666,759 B2
(45) Date of Patent: May 30, 2017

(54) GROWTH SUBSTRATE, NITRIDE SEMICONDUCTOR DEVICE AND METHOD OF MANUFACTURING THE SAME

(71) Applicant: LG ELECTRONICS INC., Seoul (KR)

(72) Inventors: Jonghyun Rho, Seoul (KR); Minseok Choi, Seoul (KR); Taehyeong Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/184,146

(22) Filed: Feb. 19, 2014

(65) Prior Publication Data

US 2014/0239310 A1  Aug. 28, 2014

(30) Foreign Application Priority Data

Feb. 22, 2013  (KR) .................. 10-2013-0019212

(51) Int. Cl.
*H01L 33/32* (2010.01)
*H01L 21/02* (2006.01)
(Continued)

(52) U.S. Cl.
CPC .......... *H01L 33/32* (2013.01); *H01L 21/0243* (2013.01); *H01L 21/0254* (2013.01); *H01L 21/02425* (2013.01); *H01L 21/02444* (2013.01); *H01L 21/02458* (2013.01); *H01L 21/02494* (2013.01); *H01L 21/02505* (2013.01); *H01L 33/007* (2013.01); *H01L 33/0075* (2013.01); *H01L 33/0079* (2013.01); *H01L 33/12* (2013.01); *H01L 33/16* (2013.01)

(58) Field of Classification Search
CPC ................ H01L 33/32; H01L 33/0075; H01L 21/02425; H01L 21/0243; H01L 21/02444; H01L 21/02458; H01L 21/02494; H01L 21/02505; H01L 21/0254; H01L 33/007; H01L 33/0079
See application file for complete search history.

(56) References Cited

U.S. PATENT DOCUMENTS 4,072,797 A * 2/1978 Gass ................. C21D 1/70 376/305
8,158,200 B2 * 4/2012 Kelber .................. 427/255.38
(Continued)

FOREIGN PATENT DOCUMENTS

CN       1933205 A      3/2007
CN     101931035 A     12/2010
(Continued)

*Primary Examiner* — Fazli Erdem
(74) *Attorney, Agent, or Firm* — Birch, Stewart, Kolasch & Birch, LLP

(57) ABSTRACT

Disclosed is a method of manufacturing a light emitting device. More particularly, disclosed are a growth substrate, a nitride semiconductor device and a method of manufacturing a light emitting device. The method includes preparing a growth substrate including a metal substrate, forming a semiconductor structure including a nitride-based semiconductor on the growth substrate, providing a support structure on the semiconductor structure, and separating the growth substrate from the semiconductor structure.

8 Claims, 9 Drawing Sheets

(51) Int. Cl.
*H01L 33/00* (2010.01)
*H01L 33/12* (2010.01)
*H01L 33/16* (2010.01)

(56) References Cited

U.S. PATENT DOCUMENTS

| | | | |
|---|---|---|---|
| 8,338,825 B2* | 12/2012 | Kelber | 257/40 |
| 2007/0034892 A1 | 2/2007 | Song | |
| 2009/0294759 A1* | 12/2009 | Woo et al. | 257/29 |
| 2010/0320445 A1 | 12/2010 | Ogihara et al. | |
| 2011/0163298 A1* | 7/2011 | Sung | 257/29 |
| 2012/0104432 A1* | 5/2012 | Shim et al. | 257/94 |
| 2012/0141799 A1* | 6/2012 | Kub et al. | 428/408 |
| 2012/0168724 A1* | 7/2012 | Park | H01L 21/8258 |
| | | | 257/29 |
| 2012/0181501 A1* | 7/2012 | Sung | 257/9 |
| 2012/0244358 A1* | 9/2012 | Lock et al. | 428/412 |
| 2012/0258587 A1* | 10/2012 | Kub et al. | 438/610 |
| 2012/0282489 A1* | 11/2012 | Shin et al. | 428/688 |
| 2012/0325296 A1* | 12/2012 | Woo et al. | 136/252 |
| 2013/0240830 A1* | 9/2013 | Seacrist et al. | 257/9 |
| 2014/0087191 A1* | 3/2014 | Chua et al. | 428/408 |
| 2014/0120270 A1* | 5/2014 | Tour et al. | 427/596 |
| 2014/0291607 A1* | 10/2014 | Kim et al. | 257/9 |
| 2014/0299839 A1* | 10/2014 | Shepard et al. | 257/29 |
| 2015/0001556 A1* | 1/2015 | Kim et al. | 257/79 |

FOREIGN PATENT DOCUMENTS

| | | | |
|---|---|---|---|
| CN | 102201503 A | 9/2011 | |
| CN | 102456797 A | 5/2012 | |
| EP | 2403022 A2 | 1/2012 | |
| WO | WO 2012/088334 A1 | 6/2012 | |

* cited by examiner

GROWTH SUBSTRATE, NITRIDE SEMICONDUCTOR DEVICE AND METHOD OF MANUFACTURING THE SAME

This application claims the benefit of Korean Patent Application No. 10-2013-0019212, filed on Feb. 22, 2013, which is hereby incorporated by reference as if fully set forth herein.

BACKGROUND OF THE INVENTION

Field of the Invention

The present invention relates to a method of manufacturing a light emitting device and more particularly to a growth substrate, a nitride semiconductor device and a method of manufacturing a light emitting device.

Discussion of the Related Art

Light emitting devices such as light emitting diodes (LEDs) are well-known semiconductor light emitting devices which convert electric current into light and have been widely used as light sources for image display of electronic devices including information technology devices together with GaP:N green LEDs, since red LEDs using GaAsP compound semiconductors were produced on a commercial scale in 1962.

A wavelength of light emitted from such LEDs depends on semiconductor materials used for manufacture of LEDs. The reason for this is that wavelength of light depends on a band-gap of a semiconductor material indicating the difference in energy between electrons of the valence band and electrons of the conduction band.

Gallium nitride (GaN) compound semiconductors attract much attention in the field for development of high-power electronic part devices including LEDs due to superior thermal stability and wide band gap (0.8~6.2 eV).

The reason for this is that GaN combines with other element such as indium (In) or aluminum (Al), thus enabling production of semiconductor layers emitting green, blue and white light.

Characteristics of materials suitable for characteristics of certain devices can be obtained through control of wavelength of emitted light. For example, white LEDs which replace blue LEDs and incandescent lamps beneficial to optical recording are manufactured using GaN.

Based on advantages of such GaN-based materials, the GaN-based LED market is rapidly growing. Accordingly, GaN-based photoelectrical device technology has been remarkably developed since it commercially emerged in 1994.

Meanwhile, GaN-based semiconductors are more difficult to grow than other Group III-V compound semiconductors because high-quality substrates, that is, wafers containing a material such as GaN, InN or AlN are not present.

Accordingly, an LED structure is grown on a substrate having a heterostructure such as sapphire. In this case, many defects occur and affect performance of LEDs.

In particular, in the process of disassembling the substrate having a heterostructure from the LED structure, the LED structure may be damaged or yield may be deteriorated. For this reason, there is a need for a substrate structure and manufacturing method thereof which obtain a high yield.

SUMMARY OF THE INVENTION

Accordingly, the present invention is directed to a growth substrate having a heterostructure, a nitride semiconductor device and a method of manufacturing the same that substantially obviate one or more problems due to limitations and disadvantages of the related art.

An object of the present invention is to provide a growth substrate, a nitride semiconductor device and a method of manufacturing a light emitting device to enable production of nitride semiconductors with high quality and improve yield during manufacture of light emitting devices.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of manufacturing a nitride semiconductor device includes preparing a growth substrate including a metal substrate, forming a semiconductor structure including a nitride-based semiconductor on the growth substrate, providing a support structure on the semiconductor structure, and separating the growth substrate from the semiconductor structure.

In another aspect of the present invention, a method of manufacturing a nitride semiconductor device includes preparing a growth substrate including a growth base layer comprising hexagonal boron nitride (h-BN) for growing a nitride-based semiconductor on a metal substrate, forming a semiconductor structure including a nitride-based semiconductor on the growth substrate, providing a support structure on the semiconductor structure, and separating the growth substrate from the semiconductor structure.

In another aspect of the present invention, a growth substrate for growing a nitride semiconductor device includes a metal substrate and a growth base layer disposed on the metal substrate, the growth base layer comprising hexagonal boron nitride.

In another aspect of the present invention, a nitride semiconductor device includes a support structure, a semiconductor structure disposed on the support structure, the semiconductor structure including a nitride semiconductor and a first conductive-type semiconductor layer, an active layer and a second conductive-type semiconductor layer, an auxiliary electrode disposed on the semiconductor structure, the auxiliary electrode comprising graphene electrically connected to the second semiconductor layer, a first electrode connected to the auxiliary electrode, and a second electrode electrically connected to the first semiconductor layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide further understanding of the disclosure and are incorporated in and constitute a part of this application, illustrate embodiments of the disclosure and together with the description serve to explain the principle of the disclosure. In the drawings.

DETAILED DESCRIPTION OF THE INVENTION

Figure 1:
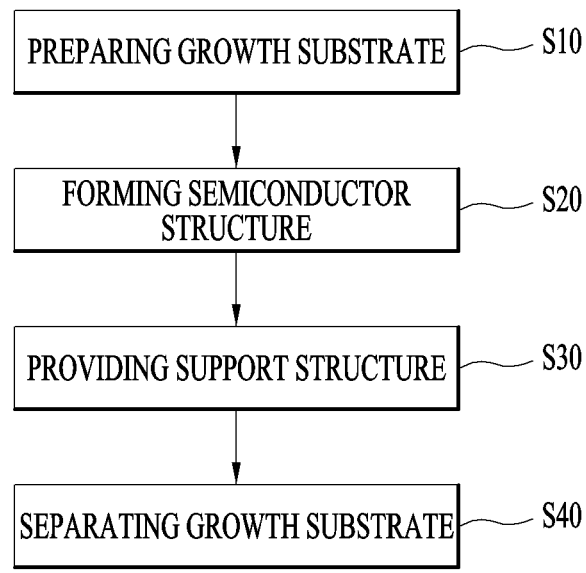
FIG. 1 is a flowchart illustrating an example of a method of manufacturing a nitride semiconductor device.

Reference will now be made in detail to the specific embodiments of the present invention, examples of which are illustrated in the accompanying drawings.

However, the present invention allows various modifications and variations and specific embodiments thereof are described in the drawings and will be described in detail. The present invention should not be construed as limited to the embodiments set forth herein and includes modifications, variations, equivalents, and substitutions compliant with the spirit or scope of the present invention defined by the appended claims.

It will be understood that when an element such as a layer, area or substrate is referred to as being "on" another element, it can be directly on the element, or one or more intervening elements may also be present.

In addition, it will be understood that although terms such as "first" and "second" may be used herein to describe elements, components, areas, layers and/or regions, the elements, components, areas, layers and/or regions should not be limited by these terms.

FIG. 1 is a flowchart illustrating an example of a method of manufacturing a nitride semiconductor device. Hereinafter, the method of manufacturing the nitride semiconductor device will be described with reference to accompanying drawings together with FIG. 1.

Figure 2:
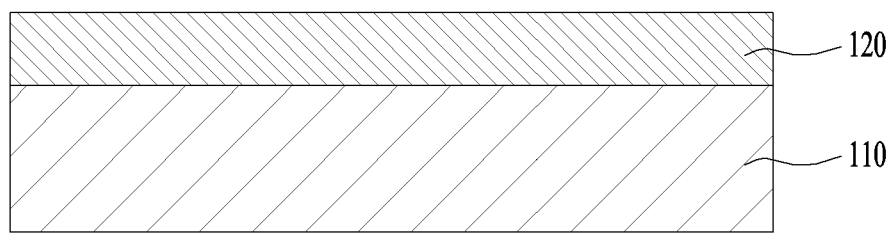
FIGS. 2 and 3 are sectional views illustrating an example of a growth substrate.

FIG. 2 illustrates a growth substrate 100 including a metal substrate 110. The growth substrate 100 is used to produce a light emitting device including a compound semiconductor employing the metal substrate 110 including a transition metal such as platinum (Pt) or copper (Cu).

The metal substrate 110 may include at least one of nickel (Ni), copper (Cu), platinum (Pt), palladium (Pd), rhodium (Rh), cobalt (Co), iron (Fe), gold (Au), aluminum (Al), chromium (Cr), magnesium (Mg), manganese (Mn), molybdenum (Mo), tantalum (Ta), titanium (Ti), tungsten (W), uranium (U), vanadium (V) or zirconium (Zr).

The growth substrate 100 may include a growth base layer 120 for growing a semiconductor on the metal substrate 110. The growth base layer 120 may provide a basis for growing a nitride semiconductor on the metal substrate 110.

Figure 3:
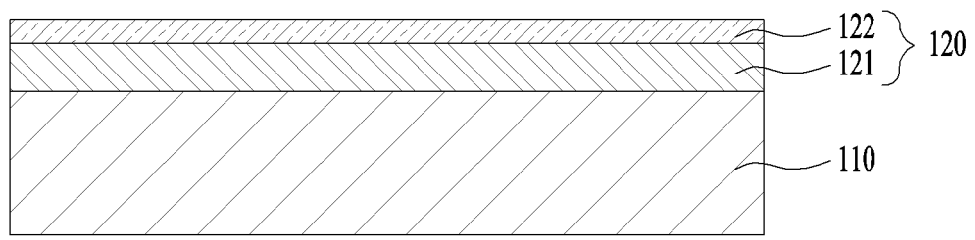

The growth base layer 120 may include a hexagonal boron nitride (h-BN) component 121 as shown in FIG. 3. The h-BN 121 is a two-dimensional substance in which one boron atom and one nitrogen atom form a hexagonal structure on a basis of unit lattice.

A lattice mismatch between the h-BN 121 and the nitride semiconductor, in particular, gallium nitride (GaN) is about 8% which is lower than a lattice mismatch between a sapphire substrate commonly used for growth of gallium nitride and gallium nitride (GaN) of 13.8%, thus enabling growth of high-quality nitride semiconductors.

In addition, the growth base layer 120 may include a graphene 122. For example, as shown in FIG. 3, the graphene 122 may be disposed on the h-BN 121.

As such, the growth base layer 120 may include either the h-BN 121 or the graphene 122, or both.

In addition, the growth base layer 120 may include a single layer of the h-BN 121 and a single layer of the graphene 122a, or include a plurality of layers of the h-BN 121 and a plurality of layers of the graphene 122.

Boron nitride (h-BN) is stable at a temperature of 3,000° C. or lower under an inert atmosphere such as gas or vacuum, but does not sublimate and thus has no potential of softening at a temperature below 3,000° C. In addition, boron nitride (h-BN) advantageously has superior thermal shock resistance due to high thermal conductivity comparable to stainless steel and does not crack or break in spite of repetition of rapid heating and rapid cooling at 1,500° C.

In addition, boron nitride has superior corrosion resistance to most organic solvents. Boron nitride does not react with a molten substance of gold (Au), silver (Ag), copper (Cu), iron (Fe), aluminum (Al), zinc (Zn), lead (Pb), tin (Sn), nickel (Ni), manganese (Mn), germanium (Ge), gallium (Ga), silicone (Si), glass and the like.

As such, the growth substrate 100 including the growth base layer 120 including at least one of the h-BN 121 and the graphene 122 on the metal substrate 110 enables growth of nitride semiconductors with excellent physical and chemical properties as well as high quality.

In the process (S10) of preparing the growth substrate 100, the h-BN 121 or the graphene 122 formed on the metal substrate 110 may serve as a diffusion barrier which prevents mutual diffusion between the metal substrate 110 and the substance formed on the growth substrate 100 during formation of the light emitting device structure on the growth substrate 100.

In addition, in the subsequent process of separating the light emitting device structure from the growth substrate 100, the h-BN 121 or the graphene 122 may serve as a protective film which protects the light emitting device structure.

Furthermore, the graphene 122 included in the growth substrate 100 may be used as an electrode or an auxiliary electrode, if necessary.

Hereinafter, the process (S10) of preparing the growth substrate 100 including the growth base layer 120 will be described in detail.

First, a metal substrate 110 is plasma-cleaned or chemically cleaned. The plasma cleaning may be carried out using argon (Ar) gas and the chemical cleaning may be carried out using nitric acid and deionized water. This process may be omitted, as necessary.

Then, the metal substrate 110 is placed in a tube furnace or a cold wall chamber (not shown).

Then, the metal substrate 110 is thermally treated at a temperature of about 400 to about 1,400° C. for 10 to 150 minutes while flowing $Ar/H_2$ or $N_2/H_2$ at a rate of 5 to 1,200 sccm (standard cubic centimeters per minute) in the tube furnace or the cold wall chamber.

Then, a temperature of the tube furnace or the cold wall chamber is adjusted to a BN growth temperature for 0 to 60 minutes in order to grow boron nitride (BN). At this time, the BN growth temperature ranges from 400 to 1,400° C.

Then, a h-BN 121 is grown at a temperature of 400 to 1,400° C. for 10 to 60 minutes while supplying a BN growth precursor (borazine, ammonia borane, diborane/ammonia, boron trifluoride/ammonia, boron trichloride/ammonia, hexachloroborazine or trichloroborazine) to the tube furnace or the cold wall chamber and flowing $Ar/H_2$ or $N_2/H_2$ at a rate of 10 to 500 sccm.

The BN growth precursor may be heated in a heat belt according to phase before carrying to a BN growth point. More specifically, a solid BN growth precursor is heated in a heat belt and is then carried under $N_2$ to the BN growth point, and a liquid BN growth precursor is carried under $N_2$ to the BN growth point. At this case, flow rate of $N_2$ is 1 to 100 seem.

After growth of the h-BN 121, the temperature is adjusted to 800 to 1,200° C. and the h-BN 121 is thermally treated for 10 to 90 minutes while supplying $Ar/H_2$ or $N_2/H_2$ at a flow rate of 10 to 500 sccm. This process may be omitted as necessary.

After this process, the h-BN 121 is cooled to room temperature for 20 to 240 minutes while flowing $Ar/H_2$ or $N_2/H_2$ at a flow rate of 10 to 500 sccm in the tube furnace or the cold wall chamber.

Then, a graphene 122 is formed on the h-BN 121. The formation of the graphene 122 may be carried out using a method such as chemical vapor deposition (CVD).

The chemical vapor deposition is a method of growing the graphene 122 by adding a carbon source to a chamber and providing suitable growth conditions.

Examples of the carbon source include gas phase carbon sources such as methane ($CH_4$) and acetylene ($C_2H_2$), solid phase carbon sources such as powder and polymer, and liquid phase carbon sources such as bubbling alcohol.

Furthermore, a variety of carbon sources such as ethane, ethylene, ethanol, acetylene, propane, butadiene, pentane, pentene, cyclopentadiene, hexane, cyclohexane, benzene and toluene may be also used.

An example in which methane ($CH_4$) is used as the carbon source will be described as follows. When the h-BN 121 is present and methane gas is added to the h-BN 121 at a predetermined temperature under a hydrogen atmosphere, the hydrogen reacts with the methane to form the graphene 122 on the h-BN 121. The formation of the graphene 122 may be carried out at a temperature of about 300 to about 1,500° C.

Meanwhile, the graphene 122 may be formed by forming graphene on a catalyst metal phase in a separate chamber and transferring the graphene on the h-BN 121, instead of directly forming the graphene 122 on the h-BN 121.

The formation of the graphene 122 on the h-BN 121 by the transfer method may be carried out using a heat-peelable film suitable for large-area continuous processes, but the present invention is not limited thereto.

Figure 4:
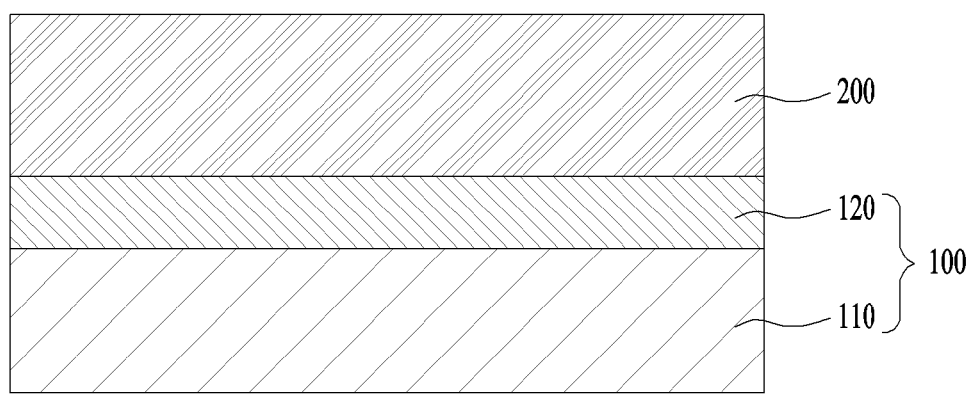
FIGS. 4 and 5 are sectional views illustrating an example of a semiconductor structure.

Then, as shown in FIG. 4, a semiconductor structure 200 including a nitride semiconductor is formed on the growth substrate 100 including the growth base layer 120 disposed on the metal substrate 110 manufactured by this process (S20).

Figure 5:
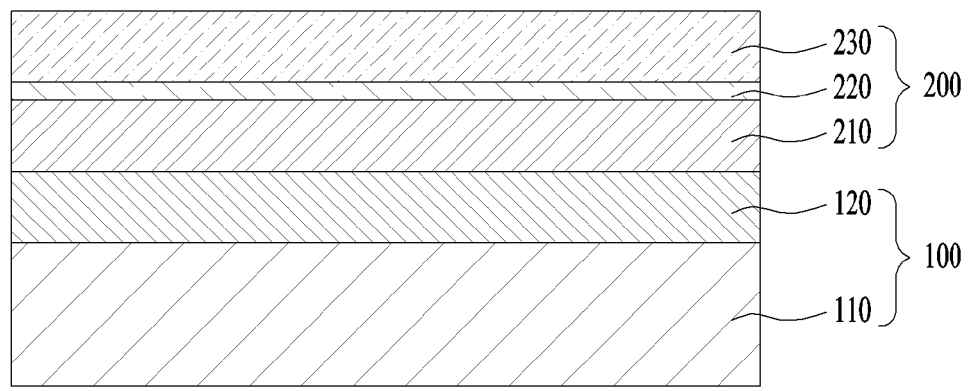

The semiconductor structure 200 may include a first conductive type semiconductor layer 210, an active layer 220 and a second conductive type semiconductor layer 230, as shown in FIG. 5. The first conductive type semiconductor layer 210 may be an n-type semiconductor layer and the second conductive type semiconductor layer 230 may be a p-type semiconductor layer.

A nitride semiconductor buffer layer (not shown) may be further disposed between the growth substrate 100 and the first conductive type semiconductor layer 210. That is, a nucleation layer for forming a growth nucleus on the growth substrate 100 and a low-temperature buffer layer grown at a relatively low temperature may be further disposed between the growth substrate 100 and the first conductive type semiconductor layer 210.

The semiconductor structure 200 may have a structure of n-type semiconductor/active layer/p-type semiconductor for manufacturing a light emitting device.

Figure 6:
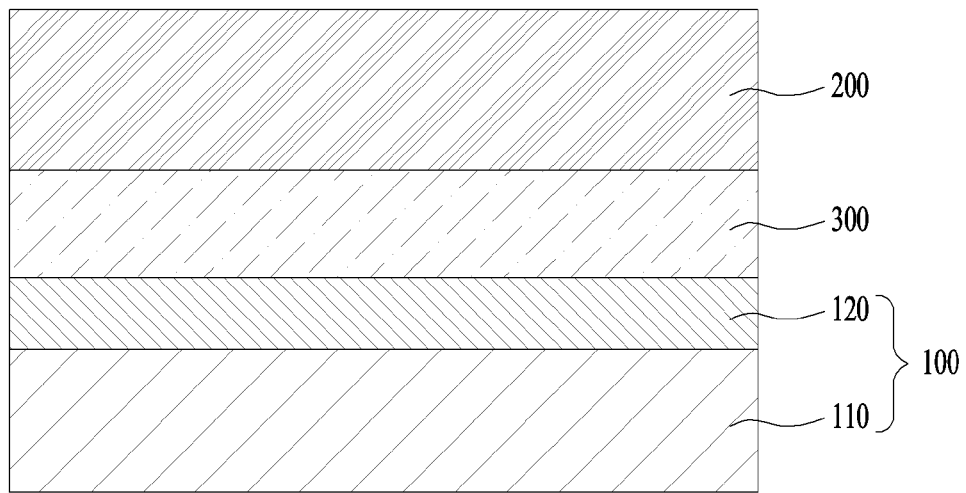
FIG. 6 is a sectional view illustrating an example of a buffer layer.

Meanwhile, as shown in FIG. 6, a separate buffer layer 300 may be disposed between the semiconductor structure 200 and the growth base layer 120 of the growth substrate 100.

The buffer layer 300 may be formed using a substance which minimizes difference in physical properties between the growth base layer 120 and the semiconductor structure 200.

Figure 7:
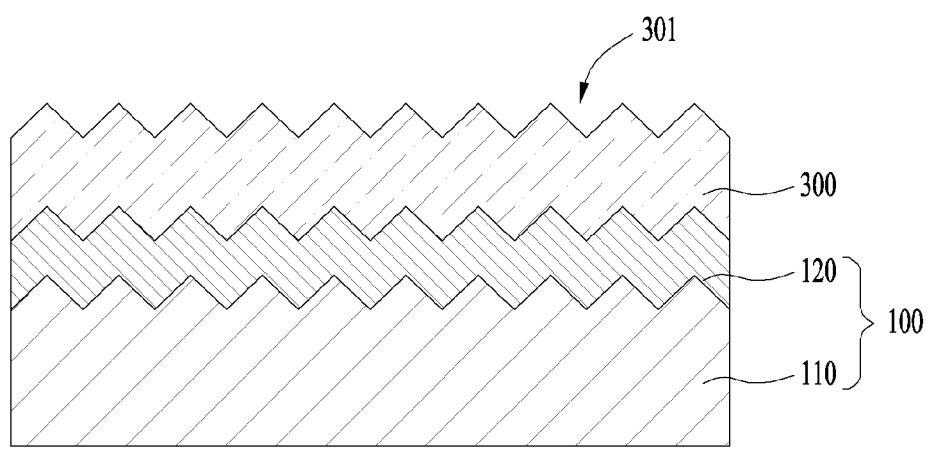
FIGS. 7 and 8 are sectional views illustrating an example of planarizing the buffer layer.

As described above, when the metal substrate 110 is included in the growth substrate 100, roughness of the surface of the growth substrate 100 may be increased in the process of forming the h-BN 121 or the graphene 122, and the surface roughness may increase surface roughness of materials deposited thereon, as shown in FIG. 7. That is, a rough surface 301 may be formed on the buffer layer 300 in such a structure.

However, surface evenness comparable to a wafer may be required in order to form a high-quality light emitting device such as a light emitting diode (LED) using a light emitting device process on the growth substrate 100.

Accordingly, a process of planarizing the upper surface of the buffer layer 300 may be added. This planarization process may be carried out by a method such as chemical mechanical polishing (CMP) in the semiconductor process.

Figure 8:
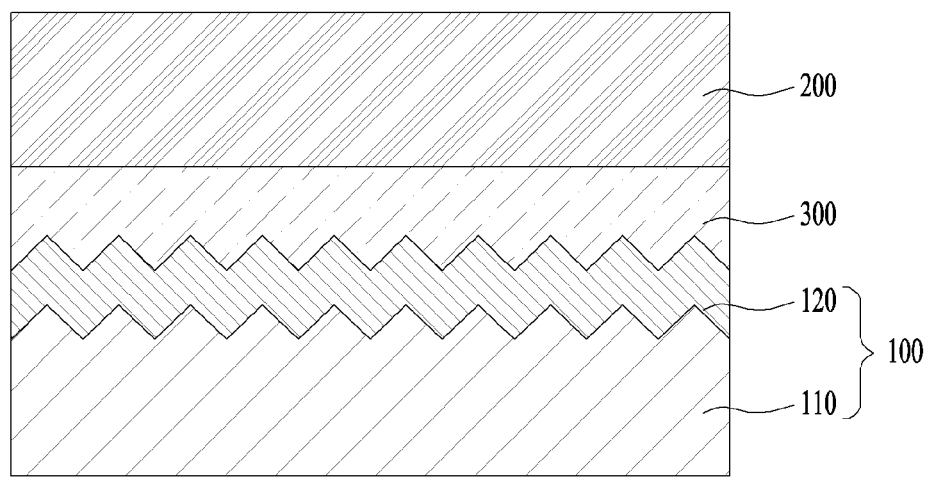

Through this process, as shown in FIG. 8, the upper surface of the buffer layer 300 may be planarized. Accordingly, the semiconductor structure 200 formed on the upper surface of the planarized buffer layer 300 may also have a flat upper surface.

In some cases, the surface of the metal substrate 110 may be also planarized by a similar process.

Figure 9:
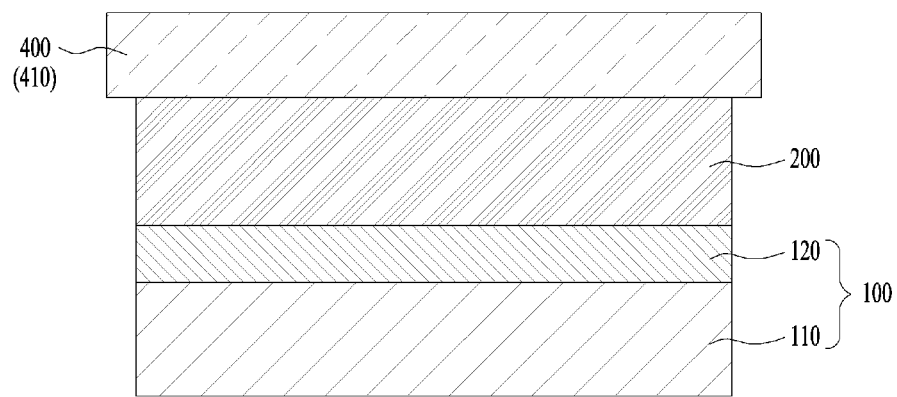
FIG. 9 is a sectional view illustrating an example of a support structure.

Then, as shown in FIG. 9, a final substrate 400 on which a light emitting device is finally formed on the semiconductor structure 200, or a support layer 410 for the subsequent transfer process may be provided (S30). Hereinafter, a structure excluding the buffer layer 300 will be described as an example.

The support layer 410 may serve as a protective layer which maintains the light emitting device structure separated from the growth substrate 100 and protects the light emitting device structure from an electrolyte used for the subsequent substrate separation process.

Thickness and formation method of material used for the support layer 410 are not limited, but polymer resins such as PMMA and PDMS which are easily formed and removed may be used.

The final substrate 400 may include a polymer substrate which has mechanical flexibility with all materials used as substrates of the light emitting device structure. The final substrate 400 may have conductivity so as to form a vertical light emitting device structure.

As such, when the vertical structure is formed, an electrode may be further disposed between the semiconductor structure 200 and the final substrate 400. The electrode will be described later.

The support layer 410 or the final substrate 400 may be directly formed on the semiconductor structure 200, or may be formed via a conductive or non-conductive adhesive layer as necessary.

In this case, either the final substrate 400 or the support layer 410 may be selected depending on the structure of a finally implemented light emitting device.

Then, the growth substrate 100 is separated from the semiconductor structure 200 (S40).

Figure 10:
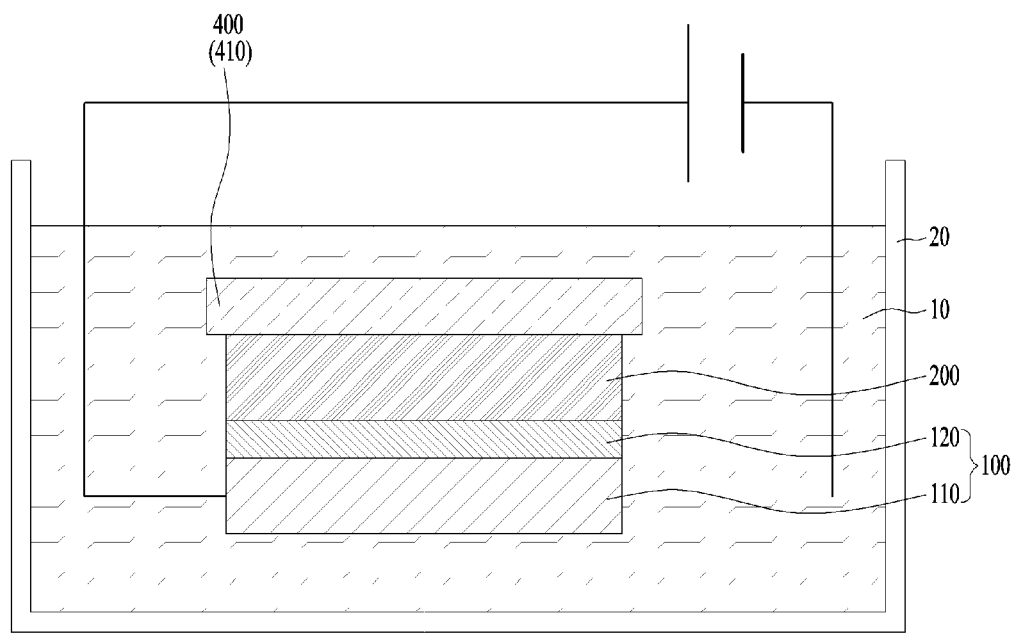
FIGS. 10 and 11 are schematic views illustrating an example of a process of separating a substrate.

The separation process of the growth substrate 100 may be a process of separating the growth base layer 120 from the metal substrate 110. The metal substrate 110 and the growth base layer 120 may be separated by an electrolysis process, as shown in FIG. 10.

Through this electrolysis process, hydrogen bubbles are formed on the surface of the metal substrate 110 and the metal substrate 110 is separated from the remaining structure such as the growth base layer 120 through the hydrogen bubbles. Accordingly, this separation process may be referred to as a bubbling transfer process.

A NaOH or $K_2S_2O_8$ solution may be used as an electrolyte solution for bubbling transfer, but the present invention is not limited thereto. A substance not affecting characteristics of devices may be selected.

The electrolysis process may be carried out in a container containing an electrolyte solution 10. A cathode is connected to the electrolyte solution 10, an anode is connected to the metal substrate 110 and an electrolysis process is performed when a predetermined voltage is applied between the cathode and the anode.

Figure 11:
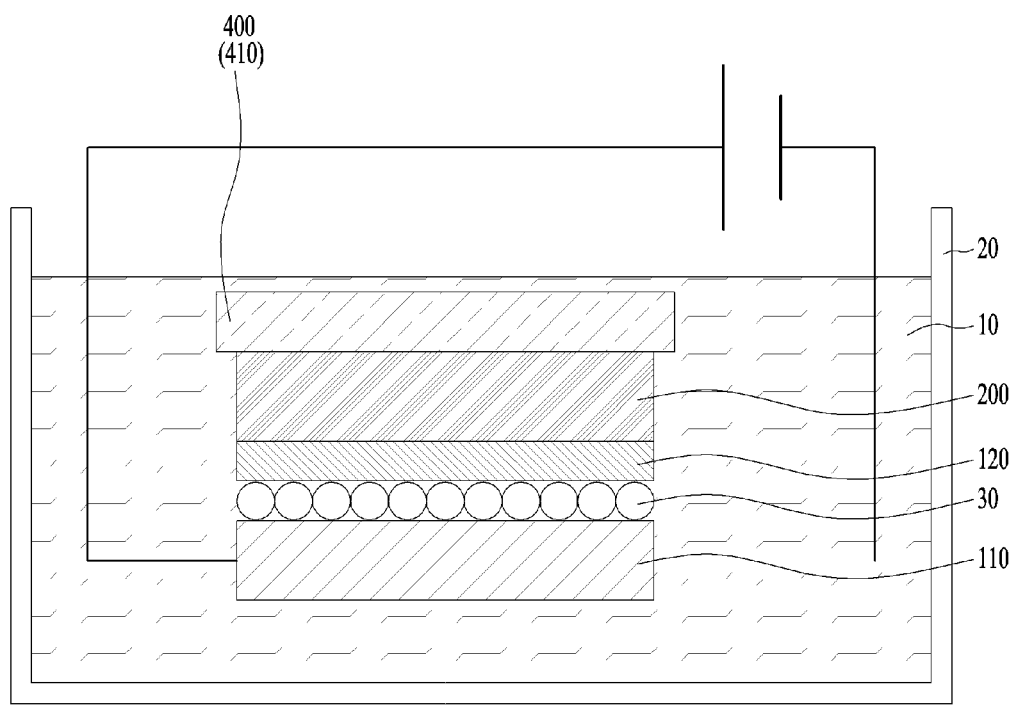

As shown in FIG. 11, as electrolysis reaction proceeds, hydrogen ($H_2$) bubbles 30 are formed on the surface of the metal substrate 110 and the metal substrate 110 is separated from the remaining structure via the bubbles 30.

Meanwhile, the separation of the growth substrate 100 may be implemented by a laser method (laser lift off; LLO), mechanical peeling or chemical or electro-chemical etching of the buffer layer 300 (chemical lift off; CLO, electro-chemical lift off; ELO) and enables processing of larger areas than a conventional method.

As described above, when the device structure and the metal substrate 110 are separated through the hydrogen bubbles 30 using the electrolysis process, the semiconductor structure 200 is not damaged by the separation process, thus having great advantages, as compared to a method such as LLO, CLO and ELO.

That is, the method, such as LLO, CLO and ELO causes damage to the semiconductor structure 200, or causes a phenomenon in which the growth substrate and the semiconductor structure are not separated well and the final substrate is separated from the semiconductor structure and thus results in great deterioration in manufacture yield. The substrate separation process using the electrolysis process enables effective separation without causing damage to the semiconductor structure 200.

Accordingly, light emitting devices with a high quality can be obtained due to great increase in yield and prevention of deterioration in quality of a thin film of the semiconductor structure for the light emitting device during manufacturing of the light emitting device.

In addition, the metal substrate 110 may be advantageously reused because it is not damaged.

Furthermore, a plastic substrate, in addition to a silicone (Si) wafer or a metal support layer, may be used as the final substrate 400, thus enabling implantation of flexible electronic devices.

Meanwhile, the growth substrate 100 suggested by the present invention enables growth of a high-quality semiconductor due to less lattice mismatch with a nitride semiconductor. A process using the growth substrate 100 enables repeated use of the metal substrate 110 and is thus eco-friendly and reduces manufacture process costs due to implementation of a large-area continuous process.

In addition, the process using the growth substrate 100 provides a manufacture process enabling a continuous process and ultimately implements a roll to roll process using a roller.

Figure 12:
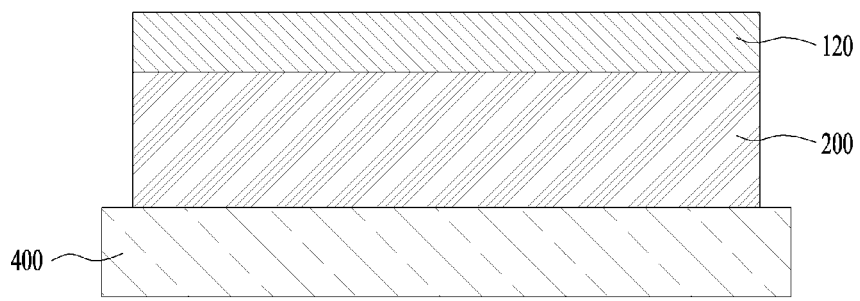
FIGS. 12 to 14 are sectional views illustrating an example of a process of manufacturing a final substrate.

In the case in which the final substrate 400 is disposed on the semiconductor structure 200, the structure shown in FIG. 12 is obtained after separation of the metal substrate 110. Accordingly, a subsequent process of manufacturing the light emitting device may further be performed.

Meanwhile, when the support layer 410 is disposed on the semiconductor structure 200, a process of transferring the semiconductor structure 200 to the final substrate 400 may be further performed.

Figure 13:
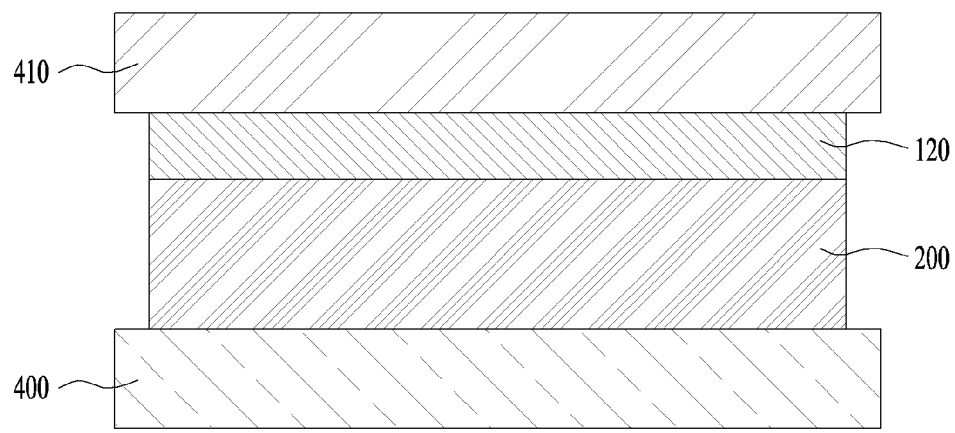
Figure 14:
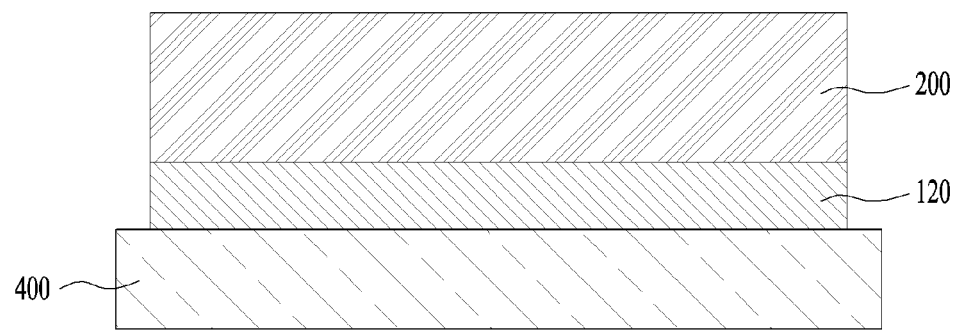

That is, as shown in FIG. 13, the final substrate 400 is disposed on the surface of the semiconductor structure on which the metal substrate 110 is separated, and the support layer 410 supporting the device structure is then removed from the final substrate 400, as shown in FIG. 14.

Then, as shown in FIG. 4, an example of a process of manufacturing a light emitting device using the semiconductor structure 200 on the growth substrate 100 will be described in detail.

Figure 15:
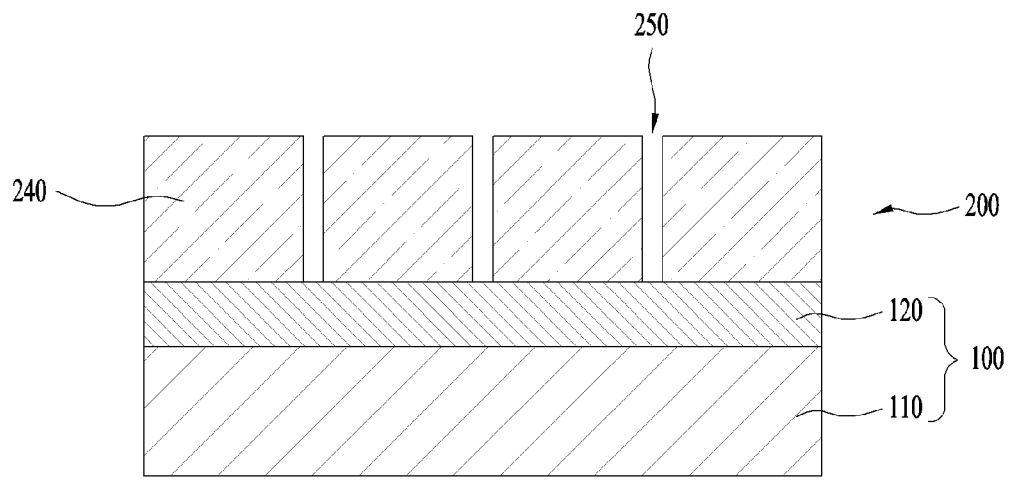
FIGS. 15 to 18 are sectional views illustrating a detailed example of a process of manufacturing a light emitting device.

First, as shown in FIG. 15, an etching process to divide the semiconductor structure 200 into separate device regions 240 is performed. This etching process may be carried out using dry etching and may be performed by forming a trench 250 which extends to the growth substrate 100 on the semiconductor structure 200.

Figure 16:
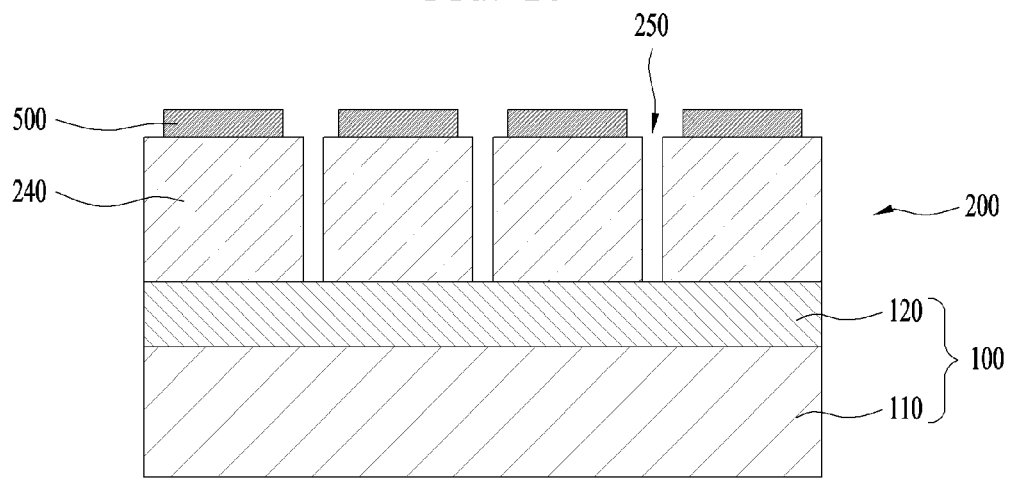

Then, as shown in FIG. 16, a first electrode 500 is formed on the separate device regions 240. When a p-type semiconductor layer is disposed on the semiconductor structure 200, the first electrode 500 is a p-type electrode.

If necessary, a passivation layer (not shown) to protect the semiconductor structure 200 may be formed in the trench 250.

Figure 17:
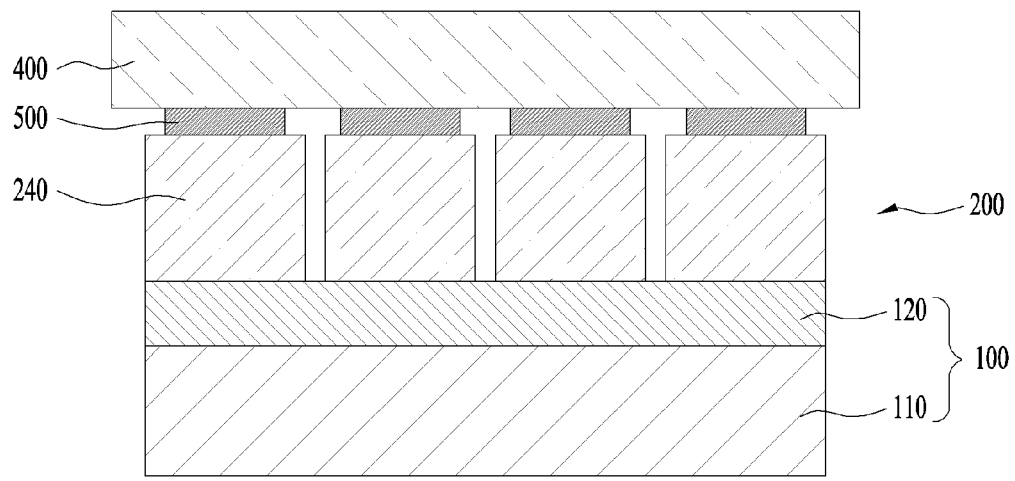

Then, as shown in FIG. 17, a final substrate 400 is bonded to the first electrode 500. The final substrate 400 may be a conductive semiconductor or a metal substrate or may be a plastic substrate for manufacturing a flexible device. Meanwhile, the final substrate 400 may include a separate bonding metal layer (not shown) such as solder.

Then, the metal substrate 110 is separated from the growth base layer 120 through an electrolysis process. Then, the h-BN 121 included in the growth base layer 120 may be removed.

Figure 18:
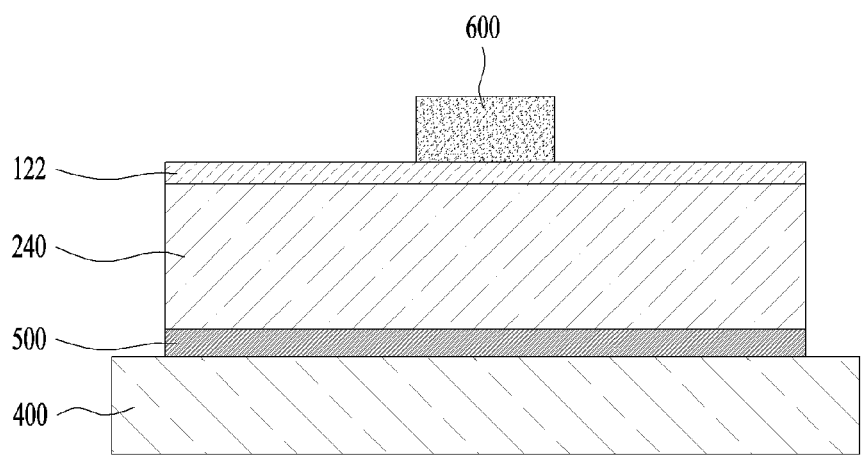

In addition, the graphene 122 exposed after removal of the h-BN 121 may be used as an electrode or a second electrode 600 is further formed on the graphene 122 to obtain a structure as shown in FIG. 18.

That is, the light emitting device manufactured through this process has a structure in which the first electrode 500 is disposed on the final substrate 400, and the separate device regions 240 of the semiconductor structure 200, the graphene 122 and the second electrode 600 are disposed on the first electrode 500 in this order.

As such, when the second electrode 600 is separately disposed, the graphene 122 may serve as an auxiliary electrode and such an auxiliary electrode may greatly improve conductivity of the separate device regions 240 of the semiconductor structure 200.

As described above, such a light emitting device is implemented as a high-quality semiconductor because the growth substrate 100 is stably separated from the device structure and improves electrical conductivity because it includes the graphene 122.

In addition, a flexible light emitting device can be manufactured using the transfer process described above and a display device can be implemented using the light emitting device.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A nitride semiconductor device comprising:
   a support structure;
   a semiconductor structure including a nitride semiconductor disposed on the support structure, the semiconductor structure comprising a first conductive-type semiconductor layer, an active layer and a second conductive-type semiconductor layer;
   an auxiliary electrode disposed on the semiconductor structure, the auxiliary electrode comprising graphene electrically connected to the second semiconductor layer, wherein the graphene serves as a diffusion barrier or a protective layer;
   a buffer layer between the semiconductor structure and the graphene, the buffer layer including a substance which minimizes difference in physical properties between the graphene and the semiconductor structure, and the buffer layer including a polished surface;
   a first electrode contacts the auxiliary electrode; and
   a second electrode electrically connected to the first semiconductor layer.

2. The nitride semiconductor device according to claim 1, wherein the support structure includes a plastic substrate or a polymer substrate.

3. The nitride semiconductor device according to claim 1, wherein the graphene covers the semiconductor structure.

4. The nitride semiconductor device according to claim 1, further comprising an adhesive layer between the semiconductor structure and the support structure.

5. The nitride semiconductor device according to claim 1, wherein the support structure includes a bonding metal layer.

6. The nitride semiconductor device according to claim 1, further comprising a passivation layer to protect the semiconductor structure.

7. The nitride semiconductor device according to claim 1, wherein the buffer layer has the polished surface by a chemical mechanical polishing.

8. The nitride semiconductor device according to claim 1, wherein the support structure serves as a protective layer which maintains the device structure and protects the device structure from a substrate separation process.

* * * * *